United States Patent [19]

Lorenzini

[11] 4,002,191
[45] Jan. 11, 1977

[54] APPARATUS AND METHOD FOR STRAIGHTENING SEMI-CONDUCTOR PINS

[76] Inventor: Gianni Lorenzini, 1049 Oregon Ave., Palo Alto, Calif. 94303

[22] Filed: Sept. 15, 1975

[21] Appl. No.: 613,497

[52] U.S. Cl. .......................... 140/147; 72/DIG. 10; 140/149
[51] Int. Cl.$^2$ ........................ B21F 1/02; B21F 7/00
[58] Field of Search ............. 72/DIG. 10, 112, 125; 140/105, 139, 140, 147, 149

[56] References Cited

UNITED STATES PATENTS

| | | | |
|---|---|---|---|
| 2,609,858 | 9/1952 | Engel | 72/112 |
| 2,861,620 | 11/1958 | Paulson | 72/112 |
| 3,013,590 | 12/1961 | Pechy | 140/147 |
| 3,349,813 | 10/1967 | Pastuszak | 140/147 |
| 3,352,331 | 11/1967 | Swyt | 140/147 |
| 3,700,011 | 10/1972 | Walter | 140/149 |

*Primary Examiner*—C.W. Lanham
*Assistant Examiner*—E. M. Combs
*Attorney, Agent, or Firm*—Phillips, Moore, Weissenberger, Lempio & Strabala

[57] ABSTRACT

The invention relates to a method and an apparatus for straightening the pins of semi-conductor devices such as transistors and the like. The apparatus includes means for holding the head of a semi-conductor device, means for preventing the pins thereof from separating from one another beyond a cylindrical volume defined by the outer diameter of the ring formed by the pins where they join the head and a plurality of pistons in one to one relation with the plurality of pins generally perpendicular to the pins, each piston aiming towards a central axis defined by the pins. Means are provided for inserting the pistons one between each of adjacent of the pins and towards the axis. A round plunger coaxial with said axis is provided, said round plunger having a diameter generally equal to the inner diameter defined by the pins. Means are provided for advancing the plunger axially towards the head between the pins. Means are further provided for propelling the pistons and the plunger to adjacent the head, rotating a respective one relative to a respective other of the head and the pistons generally a predetermined angle about the axis and rerotating said respective one relative to said respective other of said head and said pistons back generally said predetermined angle.

14 Claims, 15 Drawing Figures

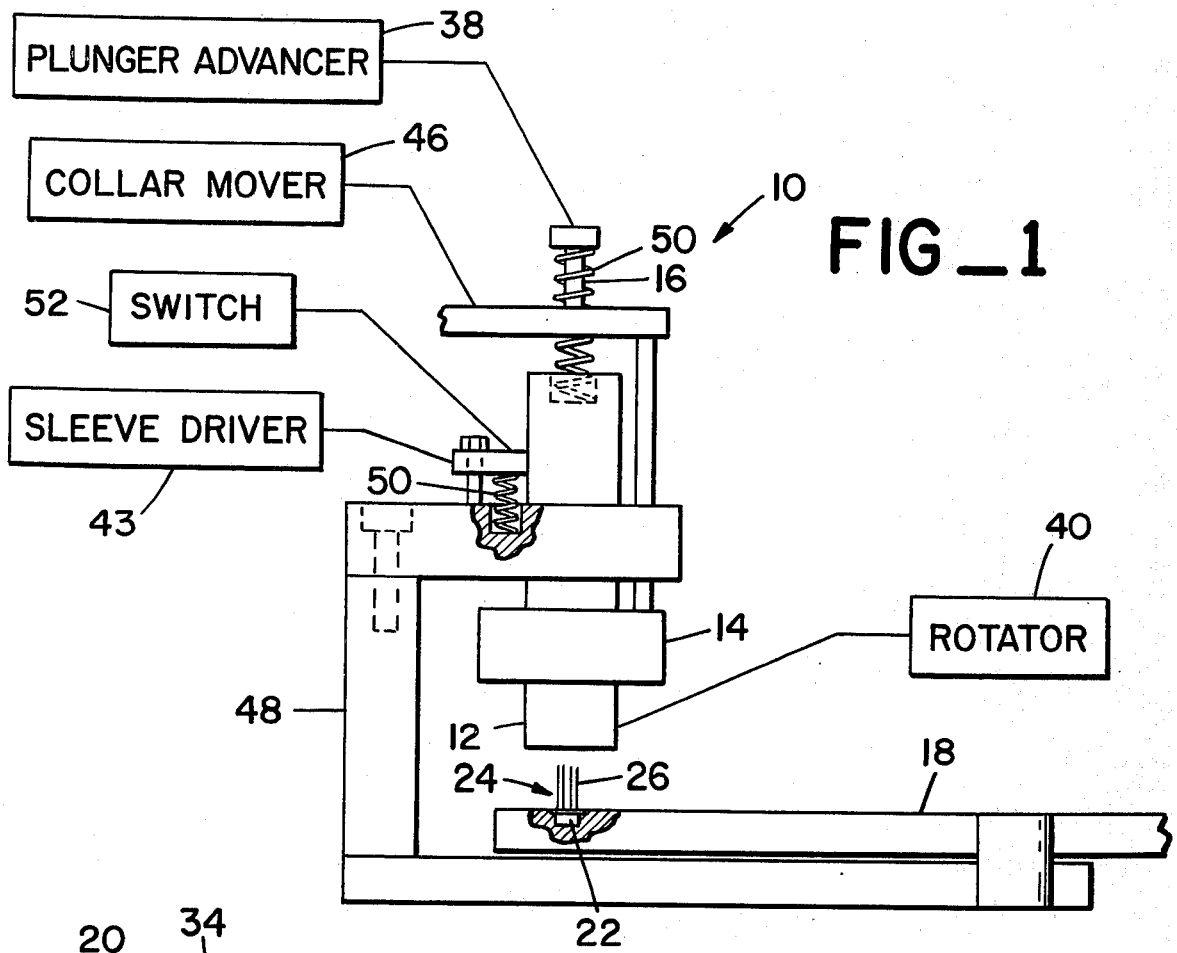
FIG_1
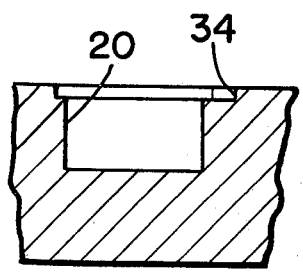
FIG_3
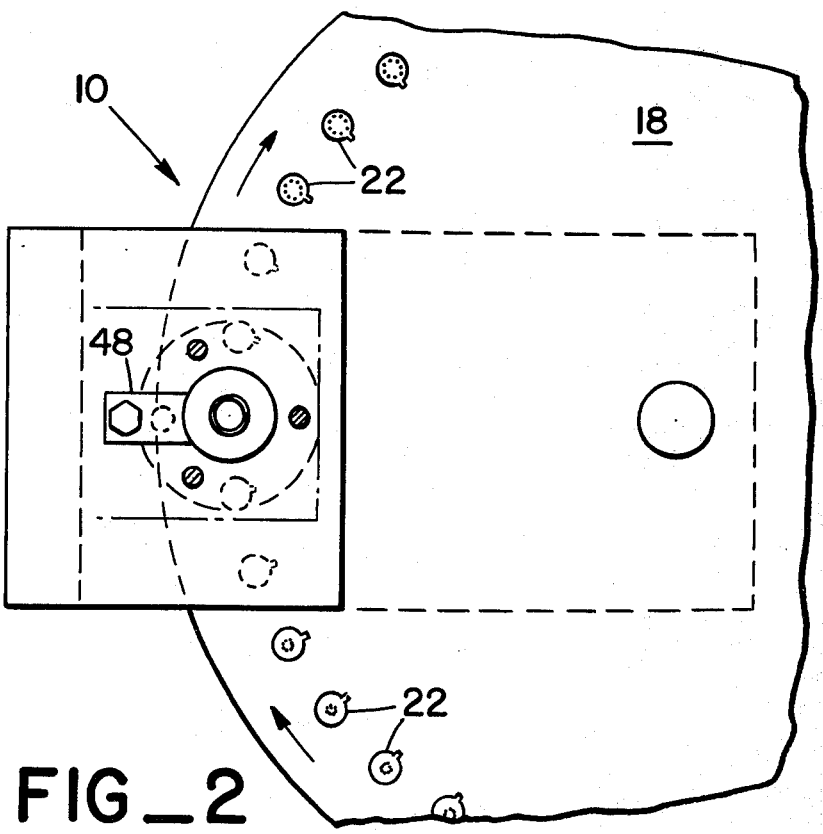
FIG_2
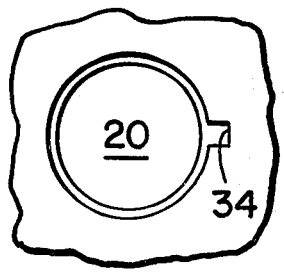
FIG_4

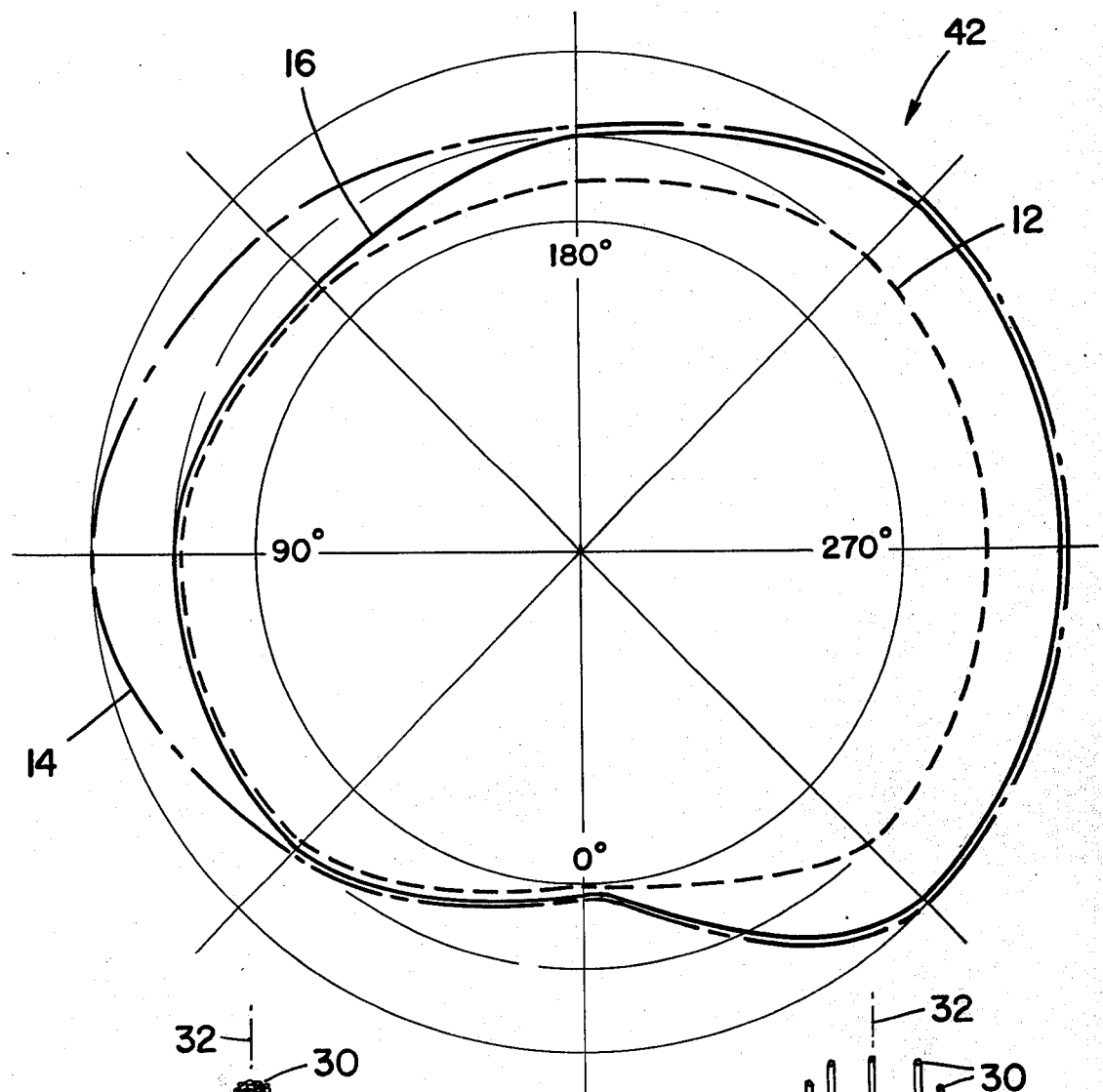
FIG_13
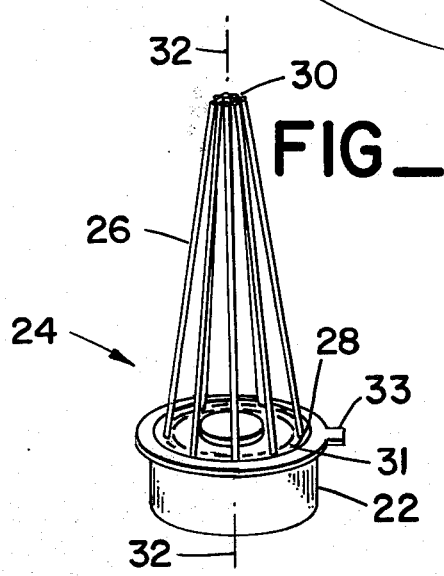
FIG_14
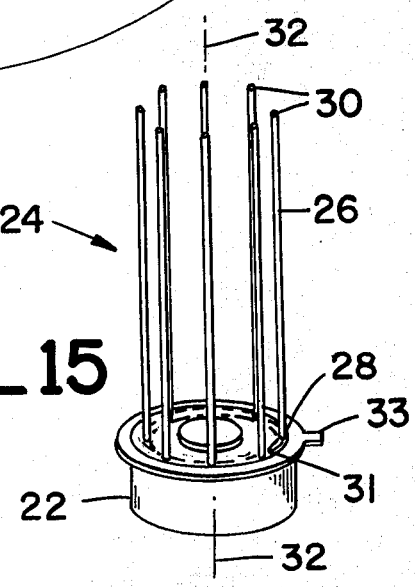
FIG_15

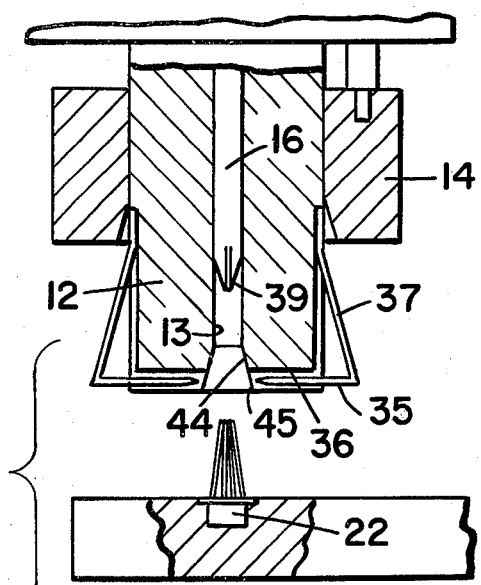
FIG_5
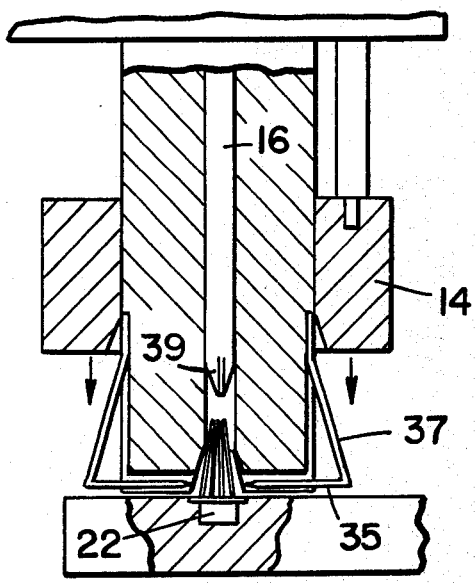
FIG_6
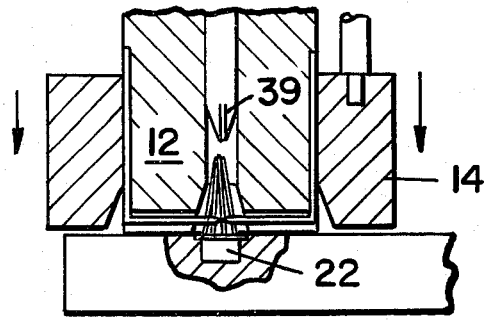
FIG_8
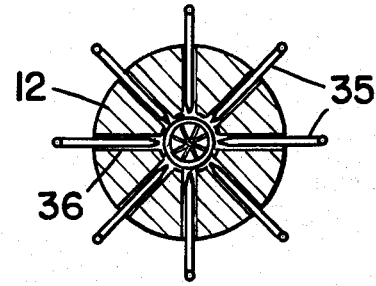
FIG_7
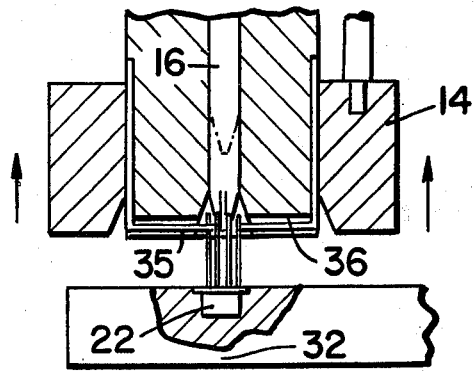
FIG_9
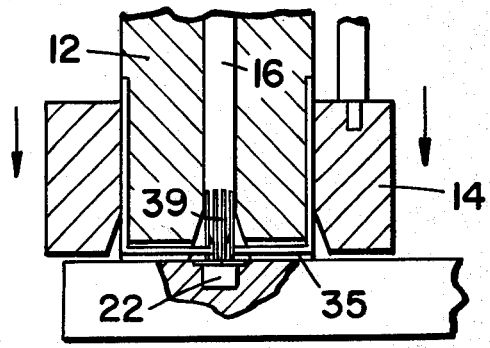
FIG_11
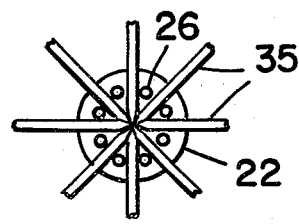
FIG_10
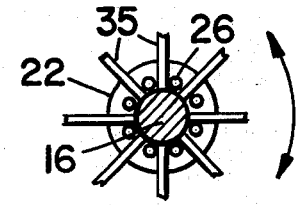
FIG_12

APPARATUS AND METHOD FOR STRAIGHTENING SEMI-CONDUCTOR PINS

BACKGROUND OF THE INVENTION

1. Field of the Invention

The invention is concerned with the art of straightening the pins or leads of a semi-conductor device so that they are substantially parallel to one another and are in condition for easy insertion into circuitry sockets.

2. Prior Art

When semi-conductor devices such as integrated circuits, transistors and the like are formulated, they are often formed with a plurality of generally equally spaced pins or leads extending therefrom. The pins are generally cut off using a metal cutting scissors or the like. This results in the pins being gathered together into a bundle. The typical prior art procedure has been to hand straighten the bundle of pins with bladed instruments or the like so that each of the pins are generally parallel one to the other and ready for insertion into a socket. This has of course required considerable time thus increasing the costs of the resulting ready to use semi-conductor devices.

It is an object of the present invention to provide a device for straightening the leads or pins of a semi-conductor device which operates automatically and in a relatively short period of time.

It is a further object of the invention to provide a method for straightening the leads of a a semi-conductor device to be substantially parallel.

These and other objects of the invention as will become apparent from the following description are accomplished as described herein.

SUMMARY OF THE INVENTION

In one sense the invention comprises an apparatus for parallel alignment of a plurality of stiff bendable pins each proceeding generally in the same direction from a common head. The apparatus comprises means for holding a head having a plurality of stiff bendable generally equally spaced pins each attached at the base end thereof to extend from said head generally in one direction to a free end thereof, the base ends of said pins defining a circular ring having an inner and an outer diameter and an axis. Means for preventing the pins from separating from one another beyond a cylindrical volume defined by said outer diameter and said axis also form a part of the apparatus. A plurality of pistons is provided in one to one relation with the plurality of pins and generally perpendicular thereto, each piston aiming towards the axis. Means are provided for inserting the pistons, one between each of adjacent of the pins towards the axis. A round plunger is provided coaxial with the axis and having a diameter generally equal to said inner diameter. Means are provided for advancing the plunger axially towards the ring with the forward end thereof between the pins and means are provided for rotating a respective one relative to a respective other of the pistons in concert and the head relative to the axis.

In another sense the invention comprises a method for parallel aligning of a plurality of stiff bendable pins each attached at a base end thereof to a head and extending to a free end removed from said head, said base ends defining a circular ring having an inner and an outer diameter and an axis. The method comprises positioning the head with the pins directed away therefrom in generally one direction, inserting a plurality of radially spaced pistons adjacent the head, one between each adjacent pair of the pins aiming towards the axis, drawing the pistons away from the head towards the free ends of the pins, advancing a round plunger having a diameter substantially equal to said inner diameter axially towards the head between the pins, propelling the pistons and the plunger to adjacent the head, rotating a respective one relative to a respective other of the head and the pistons in concert generally a predetermined angle about the axis, and rerotating the respective one relative to the respective other of the head and the pistons back generally the predetermined angle.

BRIEF DESCRIPTION OF THE DRAWINGS

The invention will be better understood by reference to the figures of the drawings wherein like numbers denote like parts throughout and wherein:

FIG. 1 illustrates in partial side elevation, partially cut away and partially in schematic, the apparatus of the present invention;

FIG. 2 illustrates in top view the apparatus shown in FIG. 1;

FIG. 3 illustrates in enlarged side section a detail in the apparatus of FIGS. 1 and 2;

FIG. 4 illustrates in top view the detail of FIG. 3;

FIGS. 5, 6, 8, 9 and 11 illustrate in partial cut away side section elevation a portion of the apparatus of the present invention in operation;

FIGS. 7, 10 and 12 illustrate in top view, in section in FIG. 7, a portion of the apparatus of the present invention in operation;

FIG. 13 illustrates a cam schematic of the operation of the apparatus and method of the present invention;

FIG. 14 illustrates a semi-conductor device with non-parallel leads or pins prior to straightening of said pins by the method and apparatus of the present invention; and FIG. 15 illustrates a semi-conductor device with parallel pins after straightening thereof by the method and apparatus of the present invention.

DETAILED DESCRIPTION OF THE PREFERRED EMBODIMENT

The preferred embodiment of the apparatus of the present invention is indicated generally by the numeral 10. The apparatus 10 includes a sleeve 12 with a bore 13, a collar 14, and a round plunger 16 operable along with a turnable table 18, all of which is illustrated generally in FIGS. 1 and 2.

The table 18 includes therein a plurality of cavities 20 as illustrated in FIGS. 3 and 4 each of which serve to hold a head 22 of a semi-conductor device 24. Each semi-conductor device 24, as illustrated in FIGS. 14 and 15 has a plurality of stiff bendable pins 26 each attached at a base end 28 to extend from the head 22 generally in one direction to a free end 30 thereof. The base ends 28 of the pins 26 define a circular ring 31 having an inner diameter, an outer diameter greater than said inner diameter by the width of said pins 26 and an axis 32. Each of the heads 22 has a tab 33 extending therefrom in generally fixed relation to the pins 26, each of said tabs 33 fitting within a recess 34 which extends from the cavity 20. Thus, the pins 26 are rotationally fixedly aligned relative to the sleeve 12. The sleeve 12 and more particularly the bore 13 thereof serves as means for preventing the pins 26 from separating from one another beyond a cylindrical volume defined generally by the outer diameter of the circular ring and by the axis 32.

A plurality of pistons 35 of any desired cross-section, e.g., round, square, triangular, etc., are provided in one to one relation with the plurality of pins 26, the pistons 35 being supported within a plurality of holes 36 in the sleeve 12 generally perpendicular to the pins 26 and aiming towards the axis 32. Means are provided for inserting the pistons one between each of adjacent of the pins 26 towards the axis 32. In the embodiment illustrated, the means for inserting the pistons comprise the collar 14 which can be moved relative to the sleeve 12 whereby said collar 14 will bear against a plurality of leaf springs 37 thus overcoming their normal outward biasing of the plurality of pistons 35 and causing said plurality of pistons 35 to be inserted towards the axis 32 and generally into contact with one another.

The plunger 16 which is cylindrical in shape is coaxial with the axis 32. The plunger 16 has a diameter generally equal to the inner diameter defined by the pins 26. Means represented schematically by a plunger advancer 38 are provided for advancing the plunger 16 axially towards the ring 31 defined by the pins 26 on the head 22 with a forward end 39 of the plunger 16, which forward end 39 is generally tapered, e.g., frustoconical, advancing between the pins 26. Means represented schematically by a rotator 40 are also provided for rotating a respective one relative to a respective other of the plurality of pistons 35 in concert with one another and the head 22 relative to the axis 32.

Generally the means for preventing the pins from separating from one another, in the preferred embodiment the bore 13 of the sleeve 12, the means for inserting the pistons 35, in the preferred embodiment the collar 14, the means for advancing the plunger 16, in the preferred embodiment the plunger advancer 38, and the means for rotating one of the pistons 35 and the head 22 relative to the axis 32, in the preferred embodiment the plunger rotator 40 are each driven as represented by a cam arrangement as indicated generally by the numeral 42. The cam arrangement 42 can drive the sleeve 12, the collar 14, and the plunger 16 via gearing which is not specifically illustrated because of its conventional nature. As an alternative to gearing, hydraulic drive means or the like can be employed.

The apparatus includes means for drawing the pistons 35 away from the head 22 towards the free ends 30 of the pins 26. The piston drawing means is represented schematically by a sleeve driver 43. The aforementioned gearing or hydraulic drive means can serve this purpose acting in a conventional manner as driven by the cam 42. The bore 13 of the sleeve 12 serves as previously mentioned to prevent the pins 26 from separating, said sleeve 12 being coaxial with the axis 32. A bottom end 44 of the bore 13 is tapered in shape whereby it has a mouth 45 of greater diameter than the bore 13. This allows pins 26 originally bent beyond the circumference of the ring 31 to be straightened. The sleeve driver 43 serves as means driven by the cam 42 for moving the sleeve 12 axially. The sleeve 12 includes the plurality of holes 36 in which the plurality of pistons 35 ride slidingly. The plurality of holes 36 generally extend radially towards the axis 32.

The cam 42 as previously discussed provides means for moving the collar 14 relative to the sleeve 12 to contact the plurality of springs 37 and propel the pistons 35 within the holes 36 towards the axis 32. The collar moving means is represented schematically by a collar mover 46. The spring means generally comprise leaf springs as illustrated, each of which is attached at a respective one end thereof to the sleeve 12 and a respective other end thereof to one of the pistons 35.

The sleeve 12 and the plunger 16 are normally biased away from a bracket 48 to which they are mounted as by springs 50 and hence away from the table 18. Thus, the plunger advancer 38, and the sleeve driver 43 normally act to overcome the biasing of the springs 50.

In the preferred embodiment of the invention the means for holding the head 22 comprises the plurality of head shaped cavities 20 and further the apparatus includes means for successively positioning the cavities 20 each with one of the heads held in operational position therein relative to the remainder of the apparatus 10. The table 18 with the plurality of head shaped cavities 20 therein and which is rotatable about a central axis thereof serves as the head holding means. It is clear that the apparatus is aimed primarily at a situation wherein the head 22 comprises a semi-conductor housing and the pins 26 comprise electrical connector pins extending from the head 22 and adapted to fit in an electrical socket.

METHOD OF OPERATION

In operation, the head 22 is positioned with the pins 26 directed away therefrom in generally one direction. The pins 26 will generally be bunched together as shown in FIGS. 2, 5–8 and 14. The plurality of radially spaced pistons 35 are inserted adjacent the head 22, one between each adjacent pair of the pins 26 and aiming towards the axis 32. This is accomplished by lowering the sleeve 12, collar 14 and plunger 16 together as in progressing from the configuration of FIG. 5 to that of FIGS. 6 and 7 (a change from 0° to 45° in the cam arrangement of FIG. 13), then lowering the collar 14 about the sleeve 12 as in progressing from the configuration of FIGS. 6 and 7 to that of FIG. 8 (a change from 45° to 90° in FIG. 13). The pistons 35 are drawn away from the head 22 towards the free ends 30 of the pins 26. This serves to partially separate and partially make parallel the plurality of pins 26 which are initially close together at the free ends thereof because of the action of a metal scissors or the like. This is equivalent to progressing from the configuration of FIG. 8 to that of FIGS. 9 and 10 (a change from 90° to 135° in FIG. 13). This serves to further separate the free ends 30 of the pins 26. The plunger is now advanced axially as shown in FIG. 9 towards the head between the pins 26 and generally up against the pistons 35 (a change from 135° to 180° in FIG. 13). There is room to insert the plunger 16 because of the aforementioned partial separation and partial paralleling of the alignment of the pins 26 and due to the tapered shape of the end 39 of the plunger 16. Next, the pistons 35 and the plunger 16 are propelled together to adjacent the head 22. This serves to yet further separate the pins 26. This is equivalent to progressing from the configuration of FIGS. 9 and 10 to that of FIGS. 11 and 12 (a change from 180° to 225° in FIG. 13). A respective one of the head 22 and the pistons 35 is then rotated relative to a respective other of said head 22 and said pistons 35 as illustrated in FIG. 12. Generally, this rotation is for a predetermined angle. In the illustrated preferred embodiment the pistons 35 are rotated in concert relative to the fixed head 22. The rotation is about the axis 32. Then, the respective one of the head 22 and the plurality of pistons 35 is rerotated back generally said predetermined angle. This rotation followed by rerotation serves to align the plurality of pins 26 so that they are substantially parallel to one another (a change from 225° to 315° in FIG. 13). Generally, prior to drawing the pistons 35 away from the head 22 towards the free ends 30 of the pins 26, the pins 26 are enclosed in a cylindrical cavity (the bore 13) having a diameter substantially equal to the outer diameter defined by the base ends 28 of said pins 26 at said head 22. This serves to aid in the eventual parallel alignment of the pins 26.

As added steps after the rerotating is completed, the pistons 35 are retracted as is the plunger 16 and the cylindrical cavity, i.e., the sleeve 12 is removed from about the pins 26. As further added steps, the holder i.e., the respective cavity 20 with the head 22 therein is moved away from alignment with the axis 32 and another head 22 is positioned in place for a repetition of all of the previously mentioned method steps. Thus, the FIG. 5 configuration is reinitiated (a change from 315° to 360° in FIG. 13).

In operation then an operator simply places semiconductor devices with their heads 22 in a series of cavities 20 in a turnable table 18. The leads from the semi-conductor devices are then straightened as the heads pass under a straightening station comprising the apparatus 10. As the apparatus 10 rises it trips a switch 52, e.g., a microswitch, or the like thus causing the turnable table 18 to advance one position and place another semi-conductor device in position for the apparatus 10 to act upon. In this manner, a single operator can feed one or more turnable tables 18 and the speed or production of semi-conductor devices with the leads or pins thereof straightened is much higher than the rate of production of such devices by hand straightening of the pins.

While the invention has been described in connection with specific embodiments thereof, it will be understood that it is capable of further modification, and this application is intended to cover any variations, uses or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

That which is claimed is:

1. Apparatus for parallel alignment of a plurality of stiff bendable pins each proceeding generally in the same direction from a common head, comprising:
   1. Means for holding a head having a plurality of stiff bendable generally equally spaced pins each attached to a base end thereof to extend from said head generally in one direction to a free end thereof, the base ends of said pins defining a circular ring having an inner and an outer diameter and an axis;
   2. Means for preventing said pins from separating from one another beyond a cylindrical volume defined by said outer diameter and said axis;
   3. A plurality of pistons in one to one relation with said plurality of pins generally perpendicular to said pins, each piston aiming towards said axis;
   4. Means for inserting said pistons, one between each of adjacent of said pins towards said axis;
   5. A round plunger coaxial with said axis and having a diameter generally equal to said inner diameter;
   6. Means for advancing said plunger axially towards said ring with a forward end thereof between said pins; and
   7. Means for rotating said head relative to said pistons about said axis.

2. An apparatus as in claim 1, including means for drawing said pistons away from said head toward said free ends of said pins.

3. An apparatus as in claim 2, wherein said forward end of said plunger is tapered.

4. An apparatus as in claim 3, wherein said pin separation preventing means comprises a cylindrical sleeve coaxial with said axis and means for moving said sleeve axially, said sleeve including a plurality of holes extending radially towards said axis, said pistons riding slidingly within said holes.

5. An apparatus as in claim 4, wherein said piston inserting means comprises a plurality of spring means biasing said pistons away from said axis, a collar slidingly fitting about said sleeve and means for moving said collar relative to said sleeve to contact said spring means and propel said pistons towards said axis.

6. An apparatus as in claim 5, wherein said spring means comprise leaf springs each attached at a respective one end thereof to said sleeve and at a respective other end thereof to one of said pistons.

7. An appartus as in claim 6, wherein said head holding means comprises a plurality of head shaped cavities and means for successively positioning said cavities, each with one of said heads held in operational position therein relative to the remainder of said apparatus.

8. An apparatus as in claim 6, wherein said head comprises a semi-conductor housing and said pins comprise electrical connector pins extending from said head.

9. A method for parallel aligning of a plurality of stiff bendable pins each attached at a base end thereof to a head and extending to a free end removed from said head, said base defining a circular ring having an inner and an outer diameter and an axis, comprising:
   1. Positioning said head with said pins directed away therefrom in generally one direction;
   2. Inserting a plurality of radially spaced pistons adjacent said head, one between each adjacent pair of said pins aiming towards said axis;
   3. Drawing said pistons away from said head towards said free ends of said pins;
   4. Advancing a round plunger having a diameter substantially equal to said inner diameter axially towards said head between said pins;
   5. Propelling said pistons and said plunger to a position adjacent said head;
   6. Rotating said head relative to said pistons through a predetermined angle in one direction about said axis; and
   7. Rerotating said head relative to said pistons through said predetermined angle in a direction opposite to said one direction.

10. A method as in claim 9, including as an added step prior to step (3):
    Enclosing said pins in a cylindrical cavity having a diameter substantially equal to said outer diameter.

11. A method as in claim 10, including as added steps after step (7):
    8. retracting said pistons;
    9. retracting said plunger; and 10. removing said cylindrical cavity from about said pins.

12. A method as in claim 11, wherein in step (2) said pistons are inserted sufficiently to contact one another adjacent said axis.

13. A method as in claim 12, wherein step (4) said plunger is advanced to contact said pistons.

14. A method as in claim 13, including as an added step after step (10):
   11. moving said holder with said head therein away from alignment with said axis; and
   12. positioning another head as in step (1) and repeating each of said succeeding steps.

* * * * *